United States Patent
Tan et al.

(10) Patent No.: US 9,818,867 B2
(45) Date of Patent: Nov. 14, 2017

(54) SIMPLE AND COST-FREE MTP STRUCTURE

(71) Applicant: GLOBALFOUNDRIES Singapore Pte. Ltd., Singapore (SG)

(72) Inventors: Shyue Seng Jason Tan, Singapore (SG); Yuan Sun, Singapore (SG); Eng Huat Toh, Singapore (SG); Ying Keung Leung, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/522,606

(22) Filed: Oct. 24, 2014

(65) Prior Publication Data

US 2015/0054043 A1    Feb. 26, 2015

Related U.S. Application Data

(63) Continuation-in-part of application No. 14/253,878, filed on Apr. 16, 2014, now Pat. No. 9,362,374.
(Continued)

(51) Int. Cl.
H01L 27/115    (2017.01)
H01L 29/78    (2006.01)
(Continued)

(52) U.S. Cl.
CPC ...... *H01L 29/7835* (2013.01); *G11C 16/0433* (2013.01); *H01L 27/11558* (2013.01);
(Continued)

(58) Field of Classification Search
CPC ......... H01L 27/11558; H01L 29/66825; H01L 29/42324; H01L 27/11206; H01L 29/7883; H01L 29/42328; H01L 27/11517
See application file for complete search history.

(56) References Cited

U.S. PATENT DOCUMENTS 5,841,165 A    11/1998   Chang et al.
6,044,018 A    3/2000   Sung et al.
(Continued)

FOREIGN PATENT DOCUMENTS

KR     100667215 B1    1/2007

OTHER PUBLICATIONS

L. Chang et al., Non-volatile memory device with true CMOS compatibility, Electronics Letters, Aug. 19, 1999, vol. 35, No. 17.
(Continued)

*Primary Examiner* — Marc Armand
*Assistant Examiner* — Quinton Brasfield
(74) *Attorney, Agent, or Firm* — Horizon IP PTE Ltd.

(57) ABSTRACT

Non-volatile (NV) Multi-time programmable (MTP) memory cells are presented. The memory cell includes a substrate and first and second wells in the substrate. The memory cell includes first transistor having a select gate, second transistor having a floating gate adjacent to one another and on the second well, and third transistor having a control gate on the first well. The control gate is coupled to the floating gate and the control and floating gates include the same gate layer extending across the first and second wells. The transistors include first and second diffusion regions disposed adjacent to sides of the gates. The first and second diffusion regions include base lightly doped drain (LDD) and halo regions. One of the first and second diffusion regions of one of the second and third transistors includes second LDD and halo regions having higher dopant concentrations than the base LDD and halo regions.

20 Claims, 15 Drawing Sheets

Related U.S. Application Data

(60) Provisional application No. 61/839,879, filed on Jun. 27, 2013.

(51) Int. Cl.
  *H01L 49/02* (2006.01)
  *H01L 29/788* (2006.01)
  *H01L 29/423* (2006.01)
  *H01L 27/11558* (2017.01)
  *G11C 16/04* (2006.01)
  *H01L 29/94* (2006.01)

(52) U.S. Cl.
  CPC .... *H01L 29/42324* (2013.01); *H01L 29/7881* (2013.01); *H01L 29/7883* (2013.01); *H01L 29/7885* (2013.01); *H01L 29/94* (2013.01)

(56) References Cited

U.S. PATENT DOCUMENTS

| | | | |
|---|---|---|---|
| 6,124,616 A * | 9/2000 | Dennison | H01L 21/823807 257/369 |
| 6,130,840 A | 10/2000 | Bergemont et al. | |
| 6,166,954 A | 12/2000 | Chern | |
| 6,211,548 B1 | 4/2001 | Ma | |
| 6,452,835 B1 | 9/2002 | Diorio et al. | |
| 6,711,064 B2 | 3/2004 | Hsu et al. | |
| 6,727,149 B1 * | 4/2004 | Krishnan | H01L 29/66772 257/E21.345 |
| 6,740,556 B1 | 5/2004 | Hsu et al. | |
| 6,812,083 B2 | 11/2004 | Shen et al. | |
| 6,819,594 B2 | 11/2004 | Lee et al. | |
| 6,914,825 B2 | 7/2005 | Hsu et al. | |
| 6,920,067 B2 | 7/2005 | Hsu et al. | |
| 7,209,392 B2 | 4/2007 | Chen et al. | |
| 7,391,647 B2 | 6/2008 | Fang et al. | |
| 7,417,897 B2 | 8/2008 | Chen et al. | |
| 7,423,903 B2 | 9/2008 | Lin et al. | |
| 7,474,568 B2 | 1/2009 | Horch | |
| 7,508,719 B2 | 3/2009 | Horch | |
| 8,218,369 B2 | 7/2012 | Lin et al. | |
| 8,305,808 B2 | 11/2012 | Lin et al. | |
| 8,320,180 B2 | 11/2012 | Kalnitsky | |
| 8,355,282 B2 | 1/2013 | Ching et al. | |
| 8,384,155 B2 | 2/2013 | Lin et al. | |
| 2007/0241392 A1 | 10/2007 | Lin et al. | |
| 2008/0035973 A1 | 2/2008 | Lin et al. | |
| 2009/0212342 A1 * | 8/2009 | Roizin | G11C 16/10 257/316 |
| 2009/0267127 A1 * | 10/2009 | Chen | G11C 16/10 257/314 |
| 2010/0238738 A1 * | 9/2010 | Yoo | H01L 27/115 365/185.29 |
| 2011/0169993 A1 * | 7/2011 | Rhodes | H01L 27/14609 348/311 |
| 2011/0233643 A1 * | 9/2011 | Chang | G11C 16/0425 257/319 |
| 2012/0236635 A1 | 9/2012 | Ching et al. | |
| 2012/0236646 A1 | 9/2012 | Hsu et al. | |
| 2013/0020626 A1 * | 1/2013 | Tan | H01L 27/11521 257/316 |
| 2013/0093012 A1 * | 4/2013 | Zhang | H01L 29/402 257/335 |
| 2014/0015047 A1 | 1/2014 | Ng et al. | |
| 2014/0110783 A1 * | 4/2014 | Zhang | H01L 21/823814 257/344 |
| 2015/0036437 A1 | 2/2015 | Li et al. | |

OTHER PUBLICATIONS

Yanjun Ma et al., Reliability of pFET EEPROM With 70-Å Tunnel Oxide Manufactured in Generic Logic CMOS Processes, IEEE Transactions on Device and Materials Reliability, Sep. 2004, vol. 4, No. 3.

Albert Bergemont, Current limitations of floating gate NVM and new alternatives, Maxim Integrated Products, Apr. 10, 2007, EDS Meeting.

* cited by examiner

SIMPLE AND COST-FREE MTP STRUCTURE

CROSS-REFERENCE TO RELATED APPLICATIONS

This application is a continuation-in-part application of co-pending U.S. patent application Ser. No. 14/253,878, filed on Apr. 16, 2014, which claims the benefit of U.S. Provisional Application Ser. No. 61/839,879, filed on Jun. 27, 2013. All disclosures are incorporated herewith by reference in their entireties.

BACKGROUND

Multi-time programmable (MTP) memories have been recently introduced for beneficial use in a number of applications where customization is required for both digital and analog designs. These applications include data encryption, reference trimming, manufacturing identification (ID), security ID, and many other applications. Incorporating MTP memories nonetheless also typically comes at the expense of some additional processing steps. Some of the existing approaches to constructing MTP memories tend to suffer from slow access time, smaller coupling ratio and/or large cell size. Some of the existing approaches utilize band-to-band tunneling hot hole (BBHH) for erasing operation, but requires high junction band voltage and more process steps. Other existing approaches need additional coupling erase gate and coupling capacitor, and hence also require more area.

Therefore, there is a need for a simple and cost-free MTP structure to create non-volatile memory cells with the standard complementary metal oxide semiconductor (CMOS) platform.

SUMMARY

Embodiments generally relate to a simple and cost-free MTP structure. In one embodiment, a non-volatile MTP memory cell is presented. The memory cell includes a substrate and first and second wells in the substrate. The memory cell includes first transistor having a select gate, second transistor having a floating gate adjacent to one another and on the second well, and third transistor having a control gate on the first well. The control gate is coupled to the floating gate and the control and floating gates include the same gate layer extending across the first and second wells. The transistors include first and second diffusion regions disposed adjacent to sides of the gates. The first and second diffusion regions include base lightly doped drain (LDD) and halo regions. One of the first and second diffusion regions of one of the second and third transistors includes second LDD and halo regions having higher dopant concentrations than the base LDD and halo regions.

In another embodiment, a NV MTP memory cell is presented. The memory cell includes a substrate and first and second wells disposed in the substrate. The memory cell includes a first transistor having a select gate and a second transistor having a floating gate adjacent to one another and disposed over the second well, and a third transistor having a control gate disposed over the first well. The control gate is coupled to the floating gate and the control and floating gates include the same gate layer extending across the first and the second wells. The transistors include first and second diffusion regions disposed adjacent to the sides of the gates. The first and second diffusion regions include at least base lightly doped drain (LDD) regions. One of the first and second diffusion regions of one of the second and third transistors includes a second LDD region having higher dopant concentrations than the base LDD regions.

In yet another embodiment, a NV MTP memory cell is disclosed. The memory cell includes a substrate and first and second wells disposed in the substrate. The memory cell includes a storage transistor having a floating gate disposed over the second well and a control transistor having a control gate disposed over the first well. The control gate is coupled to the floating gate and the control and floating gates include the same gate layer extending across the first and the second wells. One of the storage and control transistors is an asymmetrical transistor.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products or relate to other types of devices.

Figure 1:
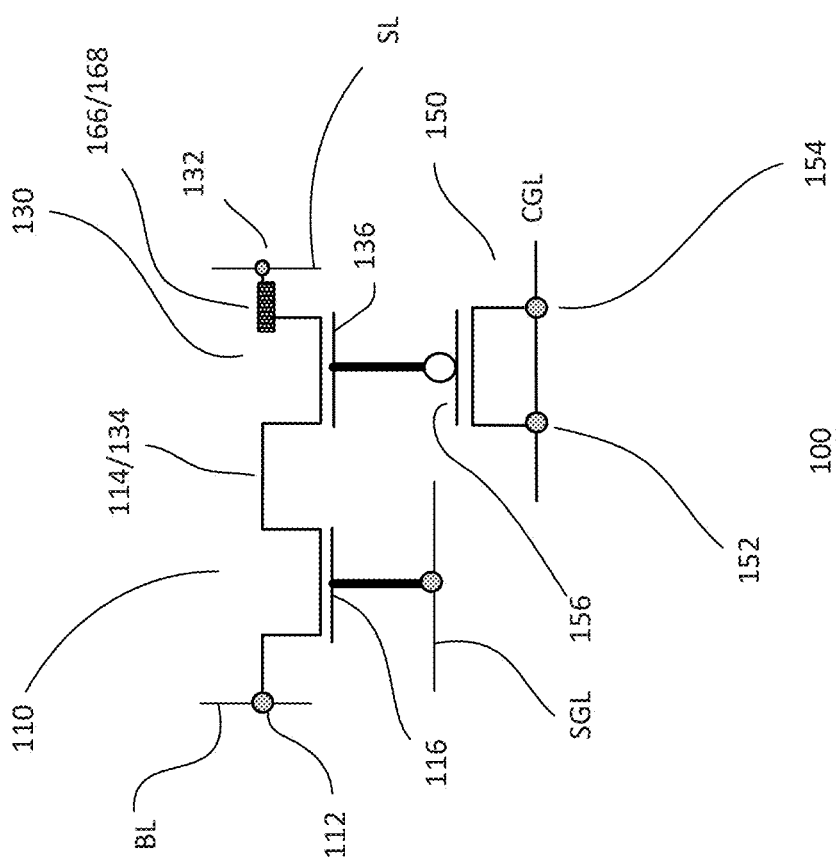
FIG. 1 shows a schematic diagram of an embodiment of a memory cell.

FIG. 1 shows a schematic diagram of an embodiment of a memory cell 100. The memory cell, in one embodiment, is a non-volatile multi-time programmable (MTP) memory cell 100. As shown in FIG. 1, memory cell 100 includes a first transistor 110, a second transistor 130 and a control gate 156. In one embodiment, memory cell 100 may be a MTP memory cell, such as a non-volatile (NV) MTP memory cell.

The first and second transistors are, for example, metal oxide semiconductor (MOS) transistors. A transistor includes a gate between first and second diffusion regions. The diffusion regions of a transistor are heavily doped regions with first polarity type dopants. The polarity type determines the type of transistor. For example, the first polarity may be n-type for a n-type transistor or p-type for p-type transistor. The transistor diffusion regions have a depth $D_T$. For example, the transistor diffusion regions have a depth from the surface of the substrate to $D_T$.

A transistor diffusion region, in one embodiment, may include base halo and lightly doped drain (LDD) regions (not shown). The halo region is a lightly doped region with second polarity type dopants. As for the LDD region, it is a lightly doped region with first polarity type dopants. For example, the halo region includes p-type dopants for a n-type transistor while the LDD region includes n-type dopants for n-type transistors. The dopant concentrations of the halo and LDD regions are lower than the transistor diffusion region. In general, the dopant concentration of the LDD is heavier or higher than the halo region. For example, the dopant concentration of the base halo region is about $1E12$ $cm^{-3}$ and the dopant concentration of the base LDD region is about $1E13$ $cm^{-3}$. Providing other dopant concentrations for the base LDD and halo regions may also be useful. For example, the dopant concentrations may be varied depending on the technology node. A depth of the LDD region is $D_L$ and a depth of the halo region is $D_H$. For example, the transistor halo and LDD regions have a depth from the surface of the substrate to $D_L$ and $D_H$, respectively. The depths $D_L$ and $D_H$ are shallower than $D_T$. In general, the LDD region is shallower than the halo region. For example, $D_L$ is less than $D_H$ ($D_L < D_H$). The halo and LDD regions extend under the gate. In one embodiment, a halo region extends further below the gate than a LDD region. The halo region, for example, extends beyond the LDD region.

A gate includes a gate electrode and a gate dielectric. The first transistor serves as an access transistor 110 while the second transistor serves as a storage transistor 130. For example, the access transistor 110 includes a first access diffusion region 112, a second access diffusion region 114 and an access gate 116; the storage transistor 130 includes a first storage diffusion region 132, a second storage diffusion region 134 and a storage gate 136. The access gate 116 may be referred to as a select gate and the storage gate 136 may be referred to as a floating gate.

In one embodiment, the control gate 156 forms a control capacitor 150. The control capacitor 150, in one embodiment, is a MOS capacitor. For example, the MOS capacitor is a transistor. For example, the control transistor or capacitor 150 includes a control gate 156 with a control gate electrode and a control gate dielectric. First and second control diffusion regions 152 and 154 are disposed adjacent to sides of the control gate 156. As for the control capacitor, it includes first and second plates separated by a dielectric layer. The control gate electrode serves as one plate of the capacitor while a control well serves as the other capacitor plate. The control diffusion regions serve as contacts to the well capacitor plate. The control capacitor isolates the storage gate, making it a floating gate.

The access and storage transistors are coupled in series. For example, the second access diffusion region and second storage diffusion region form a common diffusion region of the transistors. As for the control gate and storage gate electrodes, they are commonly coupled. By commonly coupling the control and storage gates 156 and 136, a floating storage gate is produced. In one embodiment, a common gate electrode is provided for the control and storage gates. Other configurations of the storage and control gates may also be useful.

In one embodiment, the first storage diffusion region of the storage transistor includes asymmetrical halo and LDD regions 166 and 168. The asymmetrical halo and LDD regions may be similar to the base halo and LDD regions except that they have higher dopant concentrations. For example, the asymmetrical halo and LDD regions may have similar depths to the base halo and LDD regions and overlaps the base halo and LDD regions, but the asymmetrical halo and LDD regions have higher dopant concentrations than the base halo and LDD regions. For example, the asymmetrical halo and LDD regions may be intermediately doped regions with second and first polarity type dopants, respectively. The asymmetrical halo region may be about $1E18$ $cm^{-3}$ while the asymmetrical LDD region may be about $1E19$ $cm^{-3}$. Other dopant concentrations may also be useful. The dopant concentration nay depend on, for example, technology node. Generally, the smaller the technology node, the higher the dopant concentration. The dopant concentrations provided be, for example, applied to 40 nm technology node.

In one embodiment, the asymmetrical halo and LDD regions are combinations of base and second halo and LDD regions. For example, a second implant is provided to provide second halo and LDD regions, adding to the dopant concentrations of the base halo and LDD regions to result in the asymmetric halo and LDD regions. The asymmetrical halo and LDD regions, in one embodiment, are only provided in the first storage diffusion region of the memory cell. For example, other transistor diffusion regions include only base halo and LDD regions.

The first access diffusion region 112 of first or access transistor 110 is coupled to a bit line (BL) of the memory device. The first storage diffusion region 132 of second or storage transistor 130 is coupled to a source line (SL) of the memory device. The access or select gate 116 of the first transistor 110 is coupled to a select gate line (SGL) of the memory device. The control diffusion region or other plate of the capacitor is coupled to a control gate line (CGL) of the memory device. In some embodiments, the control gate 156 is implemented as a capacitor 150. In one embodiment, the SGL is disposed along a first direction, such as a wordline direction, while the BL is disposed along a second direction, such as the bitline direction. The first and second directions, for example, are orthogonal to each other. As for the CGL, it is disposed along the wordline direction and the SL is disposed along the bitline direction. Other configurations of BL, CGL, SGL and SL may also be useful. For example, the SL may be a common SL for memory cells of an array.

As described, the memory cell includes a storage transistor which includes a first storage diffusion region with asymmetrical halo and LDD regions and a second storage diffusion region without them. For example, the non-common diffusion region of the storage transistor includes the asymmetrical halo and LDD regions while the common diffusion region of the access and storage transistors includes only base halo and LDD regions. This produces an asymmetrical storage transistor. Other asymmetrical transistor configurations may also be useful.

The asymmetry of the storage transistor creates high lateral field near the non-common diffusion region due to more abrupt p-n junction profile, resulting in enhanced electrical field, which helps to improve channel hot electron (CHE) programming efficiency.

Figure 2A:
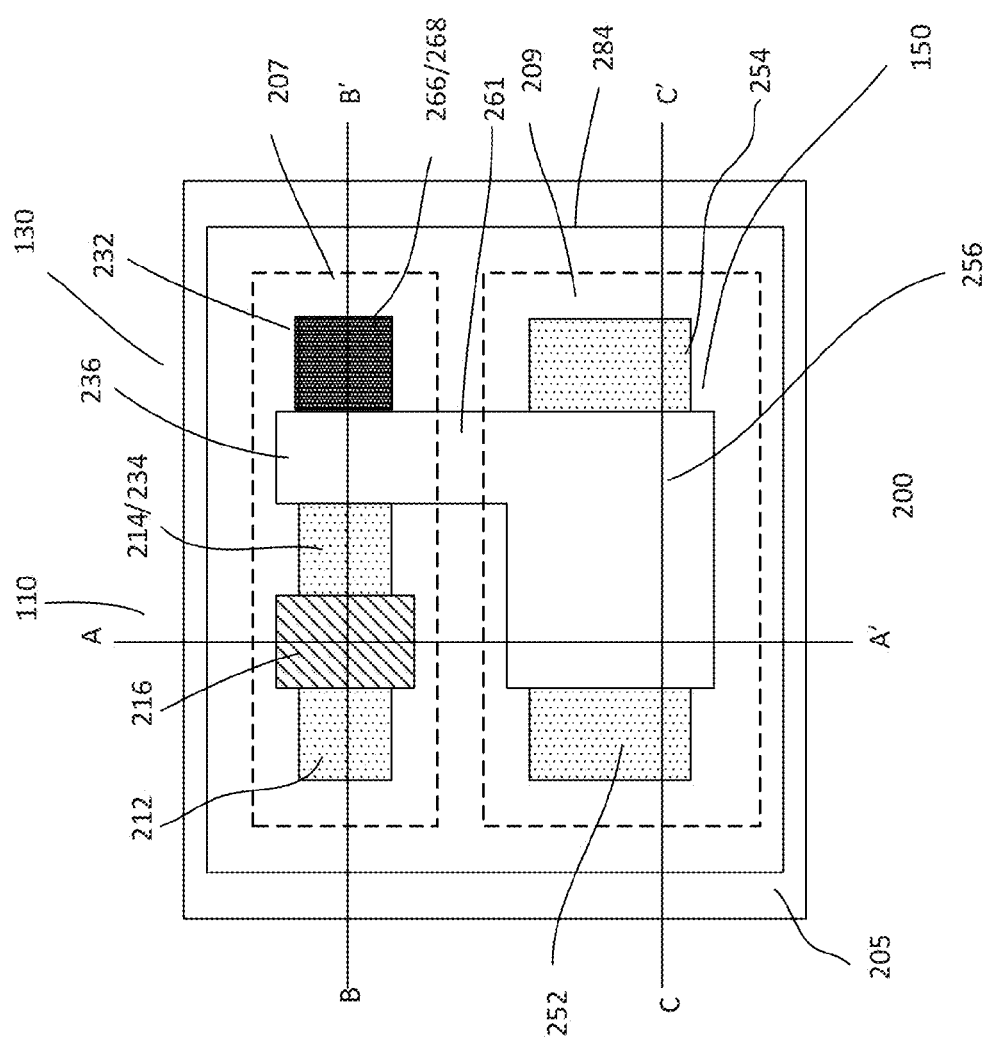
FIGS. 2a-2d show various views of one embodiment of the memory cell of FIG. 1.
Figure 2B:
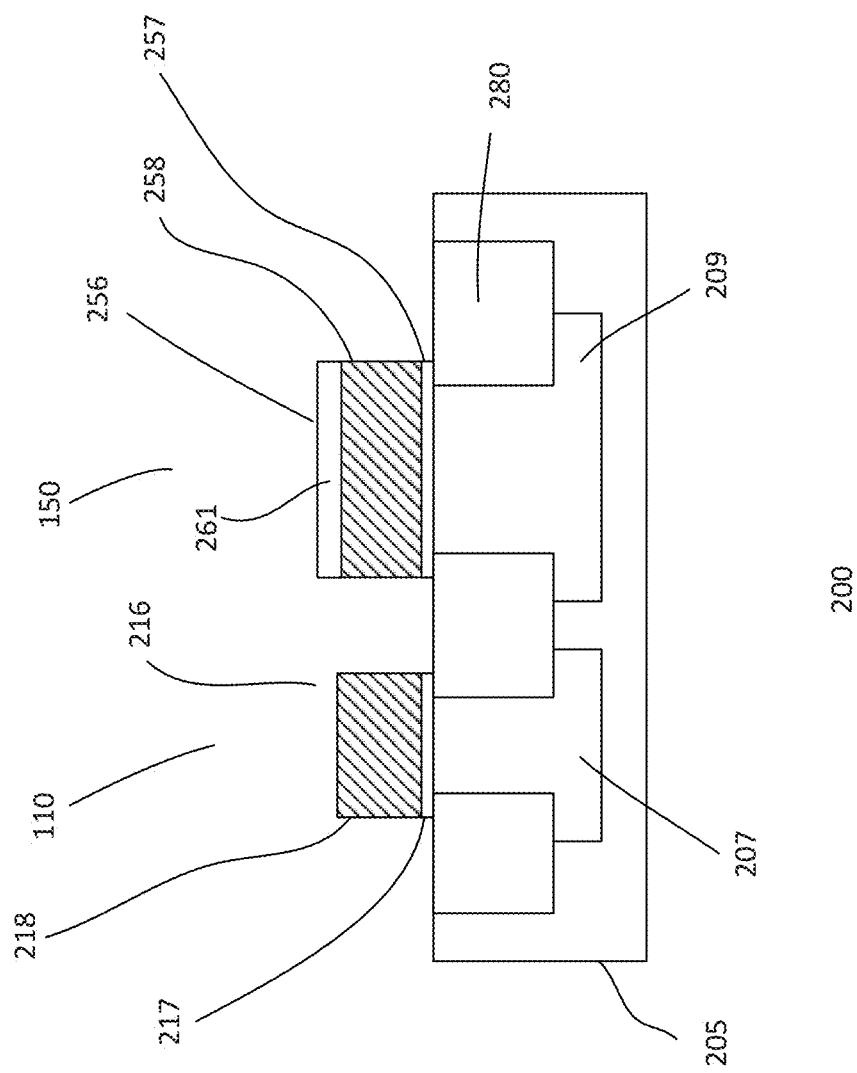
Figure 2C:
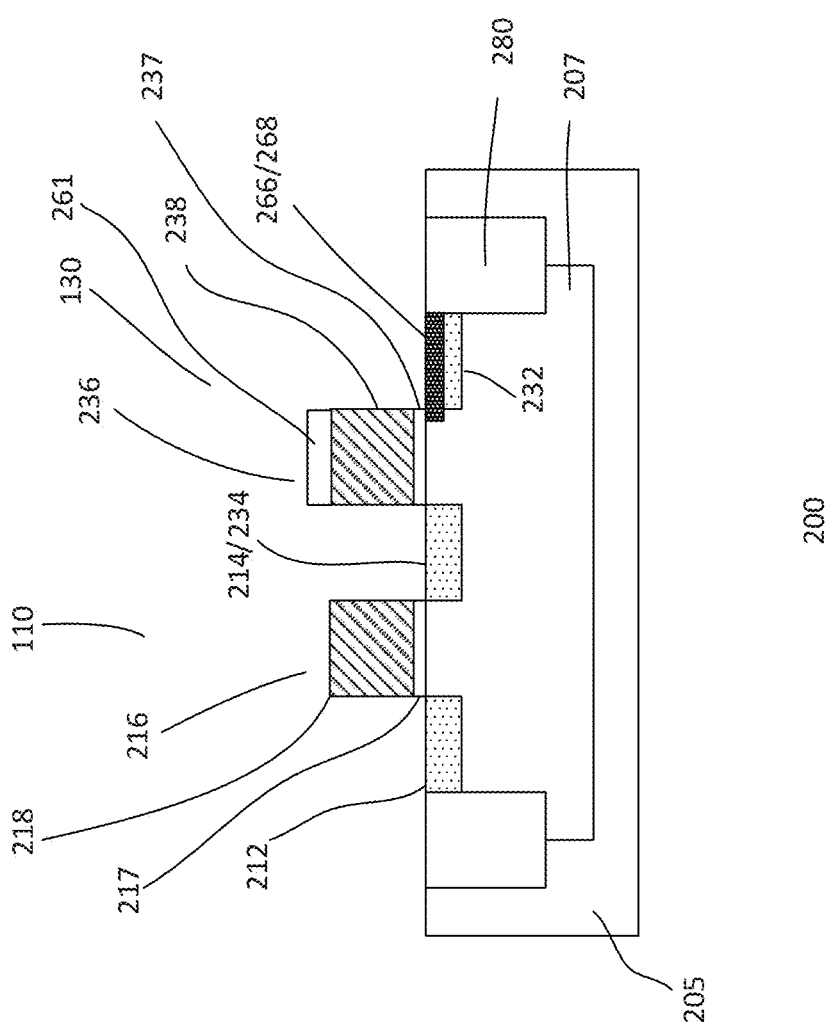
Figure 2D:
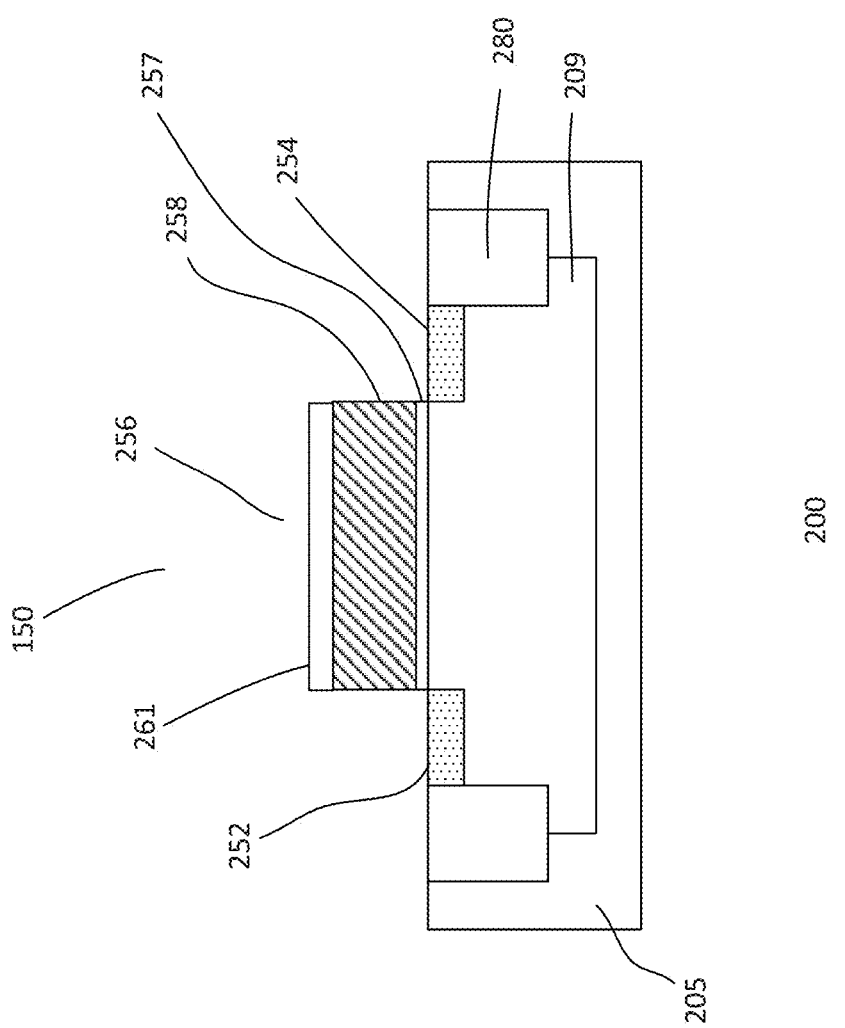

FIGS. 2a-2d show various views of one embodiment of a device. The device includes a memory cell 200. FIG. 2a shows a top view of the memory cell while FIGS. 2b-2d show cross-sectional views along A-A', B-B' and C-C' respectively. Referring to FIGS. 2a-2d, the memory cell 200 may be a non-volatile memory cell. For example, the memory cell is a non-volatile MTP memory cell. The device is disposed on a substrate 205. The substrate is a semiconductor substrate, such as a silicon substrate. Other types of semiconductor substrates may also be useful. The substrate may include a cell region 284.

The device may include doped regions having different dopant concentrations. For example, the device may include heavily doped ($x^+$) intermediately doped (x) and lightly doped ($x^-$) regions, here x is the polarity type which can be p-type or n-type dopants. A lightly doped region may have a dopant concentration of about $1E11$-$1E13$ cm$^{-2}$, an intermediately doped region may have a dopant concentration of about $1E13$-$1E19$ cm$^{-2}$, and a heavily doped region may have a dopant concentration of about $1E20$ cm$^{-2}$. Providing other dopant concentrations for the different types of doped regions may also be useful. For example, the dopant concentration ranges may be varied, depending on the technology node. P-type dopants may include boron (B), aluminum (Al), indium (In) or a combination thereof, while n-type dopants may include phosphorous (P), arsenic (As), antimony (Sb) or a combination thereof.

A cell region 284 is provided in the substrate. The cell region, for example, is a cell region in which the memory cell is disposed. Although one cell region is shown, the device may include a plurality of cell regions having multiple memory cells interconnected to form a memory array. Additionally, the substrate may include other types of device regions, depending on the types of device or IC. For example, the device may include device regions for high voltage (HV), intermediate or medium voltage (MV) and/or low voltage (LV) devices.

The cell region includes first and second wells 209 and 207. The first well serves as a control well for a control gate while the second well serves as a transistor well. For example, the transistor well serves as a well for access (or select) and storage transistors 110 and 130. In one embodiment, the control gate includes a control capacitor 150. The control capacitor may be a MOS capacitor. Other types of control gates may also be useful.

As shown, the wells are disposed adjacent to each other. The first well accommodates the control transistor or capacitor and the second well accommodates the access and storage transistors. The control well includes control well dopants and the transistor well includes transistor well dopants. The dopant concentration of the control well may be a light dopant concentration. For example, the dopant concentration of the control well may be about $1E11$-$1E13$ cm$^{-2}$. As for the transistor well, it is a lightly doped well with transistor well dopants. For example, the dopant concentration of transistor well dopants in the transistor well may be about $1E11$-$1E13$ cm$^{-2}$. Other control and/or transistor well dopant concentrations may also be useful. In one embodiment, the transistors and capacitor form MV devices. In one embodiment, the wells are tailored for MV devices. For example, wells for MV and LV devices may include different dopant concentrations to accommodate different gate configurations, such as a thicker gate dielectric layer for MV devices.

The polarity type of the control well dopant may depend on the polarity type of control gate. In one embodiment, the polarity type of the control well depends on the polarity type of the control capacitor. In the case of a control capacitor, the control well is the same polarity as the capacitor type. For example, the control well dopant is p-type for a p-type MOS capacitor or n-type for a n-type MOS capacitor. As for the polarity of the transistor well dopants, it is the opposite of the transistor type. For example, the transistor well dopants are p-type for a n-type transistor. In one embodiment, the transistor well dopants are second polarity type dopants for a first type transistor with first polarity type dopants.

A cell isolation region 280, as shown, separates the first and second wells as well as the other device regions. The cell isolation region sufficiently isolates the different wells. For example, the cell isolation region provides sufficient overlap to the different wells. The cell isolation region defines the active region in the first and second wells. For example the cell isolation region defines the active transistor regions of the transistors in the second well and active capacitor region in the first well. The cell isolation region is, for example, a shallow trench isolation region. Other types of isolation regions may also be useful.

Access and storage transistors are disposed in the transistor active region in the second or transistor well. A transistor includes a gate between first and second diffusion regions. For example, the access transistor 110 includes an access gate 216 on the substrate between first and second access diffusion regions 212 and 214 in the substrate. The access gate includes an access gate electrode 218 over an access gate dielectric 217. The access gate may be referred to as a select gate. The storage transistor 130 includes a storage gate 236 on the substrate between first and second storage diffusion regions 232 and 234 in the substrate. The storage gate includes a storage gate electrode 238 over a storage gate dielectric 237. The storage gate may be referred to as a floating gate. The access and storage transistors 110 and 130 are coupled in series. In one embodiment, the second access diffusion region 214 and second storage diffusion region 234 form a common diffusion region of the transistors. Other configurations of series connection for the access and storage gates may also be useful.

As discussed, a gate of a transistor includes a gate electrode over a gate dielectric. The gate electrode, for example, may be polysilicon gate electrode and the gate dielectric may be silicon oxide gate dielectric. The gate dielectric, for example, should be sufficient to serve as a storage dielectric for the storage transistor. For example, the gate dielectric should be sufficiently thick to prevent or reduce electron leakage, such as in the case of the storage transistor. Other types of gate electrode or dielectric materials may also be useful.

Regarding the diffusion regions of a transistor, they are heavily doped region with first polarity type dopants. The polarity type determines the type of transistor. For example, the first polarity may be n-type for a n-type transistor or p-type for a p-type transistor. The transistor diffusion regions have a depth $D_T$. For example, the transistor diffusion regions have a depth from the surface of the substrate to $D_T$.

A transistor diffusion region may include base halo and LDD regions (not shown). The halo region is a lightly doped region with second polarity type dopants. As for the LDD region, it is a lightly doped region with first polarity type dopants. For example, the halo region includes p-type dopants for a n-type transistor while the LDD region includes n-type dopants for a n-type transistor. The dopant concentrations of the halo and LDD regions are higher than the well and lower than the transistor diffusion region. In general, the dopant concentration of the LDD is heavier or higher than the halo region. For example, the dopant concentration of the base halo region is about 1E12 cm$^{-3}$ and the dopant concentration of the base LDD region is about 1E13 cm$^{-3}$. Providing other dopant concentrations for the base LDD and halo regions may also be useful. For example, the dopant concentrations may be varied depending on the technology node. A depth of the LDD region is $D_L$ and a depth of the halo region is $D_H$. For example, the transistor halo and LDD regions have a depth from the surface of the substrate to $D_L$ and $D_H$, respectively. The depths $D_L$ and $D_H$ are shallower than $D_T$. In general, the LDD region is shallower than the halo region. For example, $D_L$ is less than $D_H$ ($D_L$<$D_H$). The halo and LDD regions extend under the gate. In one embodiment, a halo region extends further below the gate than a LDD region. The halo region, for example, extends beyond the LDD region.

Dielectric spacers (not shown) may be provided on the gate sidewalls of the transistors. The spacers may be used to facilitate forming transistor halo, LDD and transistor diffusion regions. For example, spacers are formed after halo and LDD regions are formed. Spacers may be formed by, for example, forming a spacer layer on the substrate and anisotropically etching it to remove horizontal portions, leaving the spacers on sidewalls of the gates. After forming the spacers, an implant is performed to form the transistor diffusion regions.

In one embodiment, the first storage diffusion region of the storage transistor includes asymmetrical halo and LDD regions 266 and 268. The asymmetrical halo and LDD regions may be similar to the base halo and LDD regions except that they have higher dopant concentrations. For example, the asymmetrical halo and LDD regions may have similar depths to the base halo and LDD regions and overlap the base halo and LDD regions, but the asymmetrical halo and LDD regions have higher dopant concentrations than the base halo and LDD regions. For example, the asymmetrical halo and LDD regions may be intermediately doped regions with second and first polarity type dopants, respectively. The asymmetrical halo region may be about 1E18 cm$^{-3}$ while the asymmetrical LDD region may be about 1E19 cm$^{-3}$. Other dopant concentrations may also be useful. The dopant concentration may depend on, for example, technology node. Generally, the smaller the technology node, the higher the dopant concentration. The dopant concentrations provided may be, for example, applied to 40 nm technology node.

In one embodiment, the asymmetrical halo and LDD regions are combinations of base and second halo and LDD regions. For example, a second implant is provided to provide second halo and LDD regions, adding to the dopant concentrations of the base halo and LDD regions to result in the asymmetric halo and LDD regions. The asymmetrical halo and LDD regions, in one embodiment, are only provided in the first storage diffusion region of the memory cell. For example, other transistor diffusion regions only include base halo and LDD regions. Other configurations of the base and asymmetrical halo and LDD regions may also be useful.

In another embodiment, a transistor diffusion region includes a LDD region without a halo region. For example, the transistor diffusion regions include base LDD regions without base halo regions. In the case where the transistor diffusion regions include only LDD regions, the second implant provides a second LDD region in the first storage diffusion region, adding to the dopant concentration of the base LDD region to result in an asymmetric LDD region. For example, the first storage diffusion region of the storage transistor includes an asymmetrical LDD region without an asymmetrical halo region. Other configurations of the transistor diffusion regions may also be useful.

As described, the memory cell includes an asymmetrical storage transistor. In one embodiment, the asymmetrical storage transistor includes a first storage diffusion region with asymmetrical LDD and halo regions and a second storage diffusion region without asymmetrical halo and LDD regions. For example, the non-common diffusion region of the storage transistor includes asymmetrical halo and LDD regions while the common diffusion region of the access and storage transistors include only base halo and LDD regions. The asymmetry of the storage transistor creates high lateral field, resulting in improved programming efficiency.

Furthermore, the asymmetrical halo and LDD regions, as described, may be formed by a second implant. The second implant, for example, may be an implant used to form halo and LDD regions of other devices, such as HV and/or LV devices of the same polarity type as the storage and access transistors. For example, a first halo and LDD implant of HV and/or LV devices may be a second implant of other devices, such as MV devices. This enables the same mask used to form the halo and LDD regions of HV and/or LV devices to be used to form the asymmetrical halo and LDD regions of the storage transistor. The use of the same mask enables the asymmetrical device to be formed without the need of extra masks, reducing costs.

The control capacitor is disposed on the first well. The control capacitor includes a control gate 256 disposed on the substrate over the capacitor active region within the first (or capacitor) well. The control gate includes a control gate electrode 258 over a control gate dielectric 257, as shown in FIG. 2b and FIG. 2d. The control gate electrode 258, for example, may be a polysilicon control gate electrode and the control gate dielectric 257 may be silicon oxide control gate dielectric. Other types of gate electrode or dielectric materials may also be useful. The control gate electrode, in one embodiment, is doped with control or capacitor type dopants. For example, the control gate electrode is heavily doped with dopants of the same polarity type dopants as the control well. First and second capacitor diffusion regions 252 and 254 are disposed in the substrate in the capacitor active region adjacent to the control gate. The capacitor diffusion regions, in one embodiment, are heavily doped with control or capacitor type dopants. The capacitor diffusion regions serve as a contact region to a well capacitor plate formed by, for example, the first or control while the gate electrode serves as the other (or gate capacitor) plate. In one embodiment, the capacitor gate electrode is doped before forming the capacitor diffusion regions. For example, a gate electrode layer deposited on the substrate is pre-doped with control dopants and patterned to form the capacitor gate electrode. In the case where capacitor type dopants and transistor type dopants are the same polarity, the diffusion regions may be formed at the same time.

In one embodiment, the control and storage gates 256 and 236 are commonly coupled. In one embodiment, the control and storage gates form an integral unit. For example, the control and storage gates are formed of the same gate layers. For example, patterning the gate layers create the control and storage gates as a unit. In such cases, the control gate and storage gate are formed of the same material. For example, the gate electrodes are doped with capacitor type dopants. In one embodiment, the access, storage and control gates are formed from the same gate layer. Other configurations of the gates may also be useful. For example, the gates may be formed from different gate layers.

Metal silicide contacts (not shown) may be provided on contact regions of the memory cell. The metal silicide contacts, for example, may be nickel or nickel-based metal silicide contacts. Other types of metal silicide contacts may also be useful. In one embodiment, metal silicide contacts are provided on the diffusion regions of the transistors and capacitor and the gate. A silicide block 261 is disposed over the storage and control gates. The silicide block, for example, is a dielectric material, such as silicon oxide. Other types of silicide blocks may also be useful. The silicide block prevents formation of silicide contacts over the storage and control gates. This improves data retention.

The first access diffusion region 212 is coupled to a BL of the memory array. The first storage diffusion region 232 is coupled to a SL of the memory device. The access gate 216 is coupled to a SGL of the memory array. The control diffusion regions 252 and 254 are coupled to a CGL of the memory device. In some embodiments, the control gate 256 is implemented as a control capacitor 150. In one embodiment, the SGL is disposed along a first direction, such as a wordline direction, while the BL is disposed along a second direction, such as the bitline direction. The CGL may be disposed along the wordline direction and the SL is disposed along the bitline direction. Other configurations of BL, CGL, SGL and SL may also be useful.

The various lines of the memory cell may be disposed in metal levels (M) of the device. The conductive lines disposed in the same direction may be provided in the same metal level. For example, SGL and CGL may be disposed on the same level while BL and SL may be disposed on the same level. For example, SGL and CGL may be disposed on a first metal level (M1) while BL and SL may be on a second metal level (M2) of the device. Other configurations of conductive lines and metal levels may also be useful.

As an illustration, the device as described in FIGS. 1, 2a-2d may be formed by an exemplary semiconductor manufacturing process. In one embodiment, the process of forming the device includes providing a substrate prepared with one or more device or cell regions. A device region is isolated from another device region by device isolation regions, such as shallow trench isolation (STI) regions. A well is formed in each device region to accommodate various devices, such as MV and/or LV devices. A well may also be formed to accommodate other devices, such as HV devices. The devices include p-type and n-type devices. A gate dielectric layer is deposited on the substrate and across the device regions to form gate dielectric layers of the various devices. For example, a silicon oxide layer is formed on the substrate to form gate dielectric layers. The gate dielectric layer is formed with different thickness for different device regions. A gate dielectric layer of a MV device, for example, may be thicker than a gate dielectric layer of a LV device. For example, the gate oxide layer of the MV device is sufficiently thick to prevent electron leakage. In one embodiment, a gate electrode layer, such as a polysilicon layer, is deposited on the gate dielectric layer and patterned to form gate electrodes of the various devices. In one embodiment, the gate electrode layer is a doped polysilicon layer. For example, a gate electrode of a control gate is pre-doped with control or capacitor type dopants to form the control gate. Other gate electrodes may also be suitably doped to form gates of other devices. The gate electrode and gate dielectric layers are patterned to form transistor gates of devices, such as HV, MV and/or LV devices.

As described, HV, MV and/or LV devices may be formed on the same substrate. The process may continue to form a memory cell, such as a MTP memory cell. The memory cell, in one embodiment, is made of MV device. For example, the access, storage and control transistors of the memory cell are MV transistors. In one embodiment, base LDD and halo regions are formed adjacent to the sides of the transistor gates and extend under the gates. A common implant mask is employed, for example, to form the base LDD and halo regions. For example, the implant mask is used to form base halo regions in a first implant step and a second implant step is performed to form the base LDD regions into the base halo regions to form base halo and LDD regions of the transistors. Other techniques may also be used to form the base LDD and halo regions. The base LDD and halo regions of MV devices are formed in a separate step as forming LDD and halo regions of other devices, such as HV and/or LV devices.

The process continues to form base LDD and halo regions of HV and/or LV devices. In one embodiment, the implant mask which is used to form the base LDD and halo regions of HV and/or LV devices is also used to provide second LDD and halo implants into the base LDD and halo regions of a MV transistor, such as the storage transistor. For example, the second LDD and halo implants form an asymmetrical storage transistor, as described in FIGS. 1 and 2a-2d above. Providing second LDD and halo implants into other devices, such as a control transistor, may also be useful.

A dielectric spacer layer may be deposited on the substrate over the LDD and halo regions. The dielectric spacer is patterned to for gate sidewall spacers. The sidewall spacers, for example, overlap the LDD and halo regions. In one embodiment, the exposed substrate regions adjacent to the sidewall spacers are heavily doped with transistor type dopants to form transistor diffusion regions. The transistor diffusion regions are, for example, implanted deeper than the LDD and halo regions and aligned to about the gate sidewall spacers.

The process continues to complete forming the device. The processing may include forming an interlayer dielectric (ILD) layer, contacts to the terminals of the memory cell as well as one or more interconnect levels, final passivation, dicing, assembly and packaging. Other processes to complete forming the device may also be included. Other process to form the device, as described in FIGS. 1, 2a-2d, may also be useful.

The memory cell described has improved or more efficient programming due to increased capacitive coupling ratio. For example, the layout of the control gate (CG) and floating gate (FG) can be designed to have an area ratio to produce the desired capacitive coupling ration. In some embodiments, an area ratio of CG:FG may be about 0.8:0.2. For example, W×L of the floating gate may be about 0.4×0.28, while W×L of the control gate may be about 1.6×0.84. Providing other CG:FG area ratios may also useful. By providing a large area for the control gate, a high bias on the control well can be generated. This bias is transferred to the floating gate for further improving programming efficiency of the memory cell.

Figure 3A:
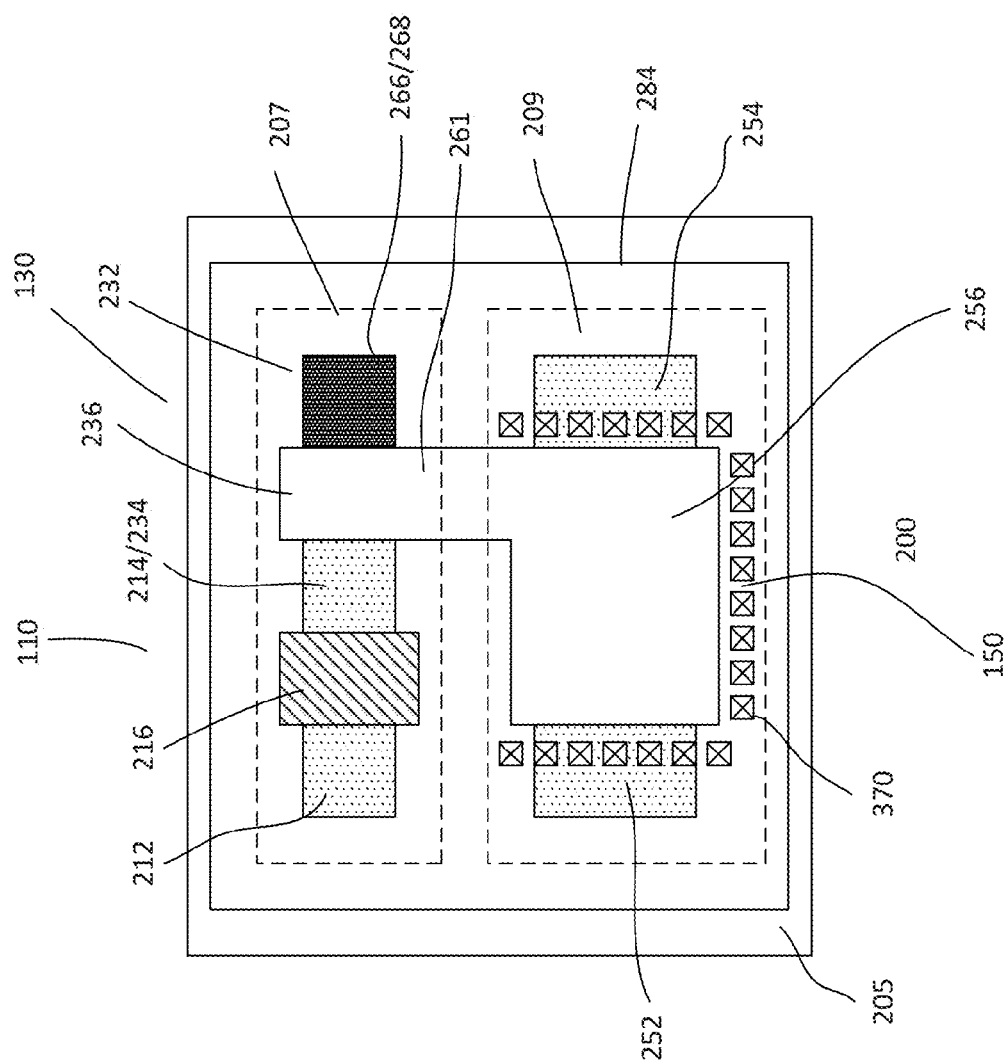
FIGS. 3a and 3b show plan views of embodiments of other memory cells.
Figure 3B:
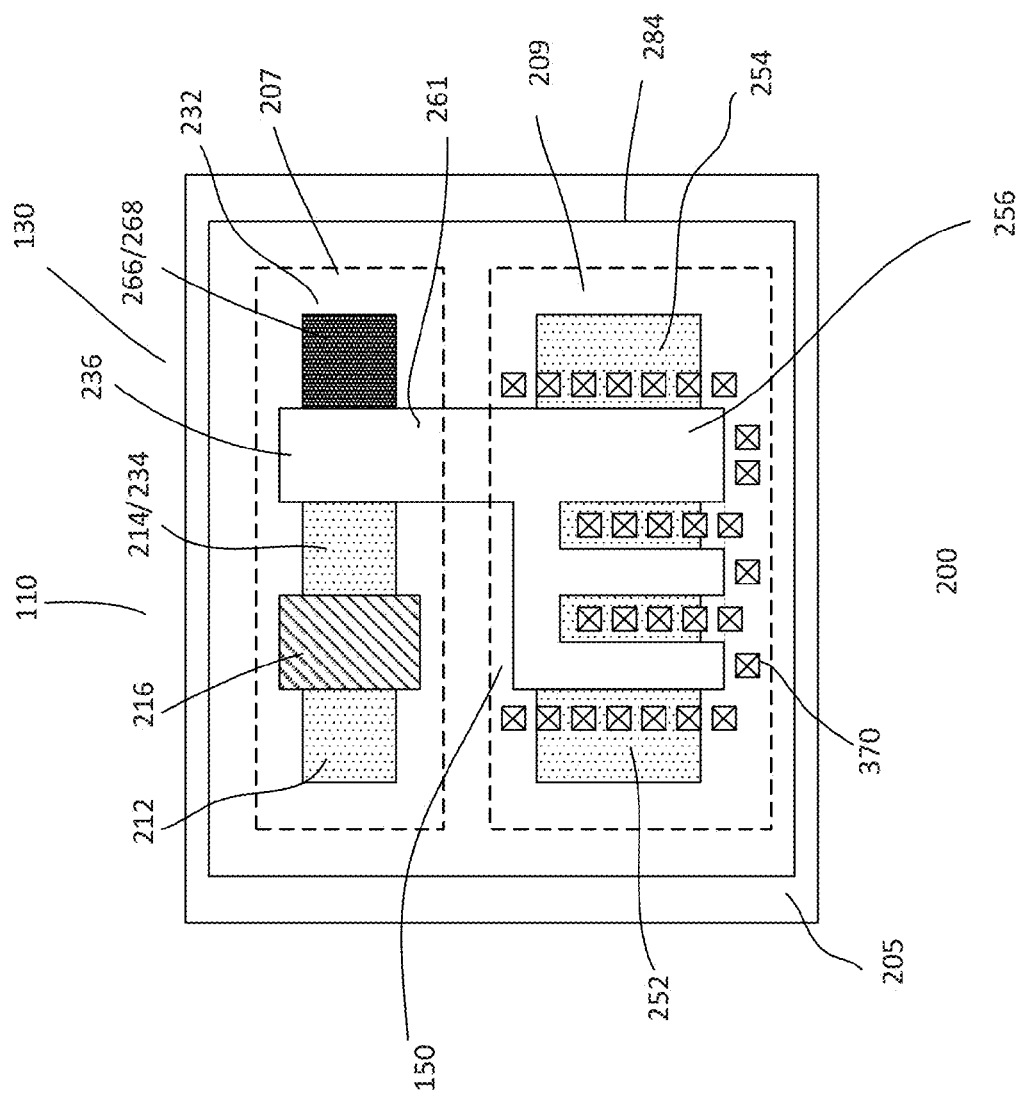

FIGS. 3a-3b show plan views of memory cells 300 with increased coupling ratio. The memory cells are similar to those described in FIG. 1 and FIGS. 2a-2d. Common elements may not be described or described in detail.

Increased capacitive coupling may be achieved by providing multiple contacts 370 coupled to the well capacitor plate 209 of the capacitor 150. The contacts, for example, are provided to surround the control gate 256, coupling the well capacitor plate to a CGL. The number of contacts may depend on the circumference of the CG and contact size and pitch. However, the greater the number of contacts, the higher the capacitance. The number of contacts may be increased by providing a CG with fingers. For example, one or more spaces may be provided to separate the CG into multiple fingers, as shown in FIG. 3b. Contacts may be provided surrounding the control gate and within the spaces between the fingers. This type of CG layout leads to a larger number of contacts provided as compared to the CG layout of FIG. 3a, thereby increasing capacitance.

Figure 4:
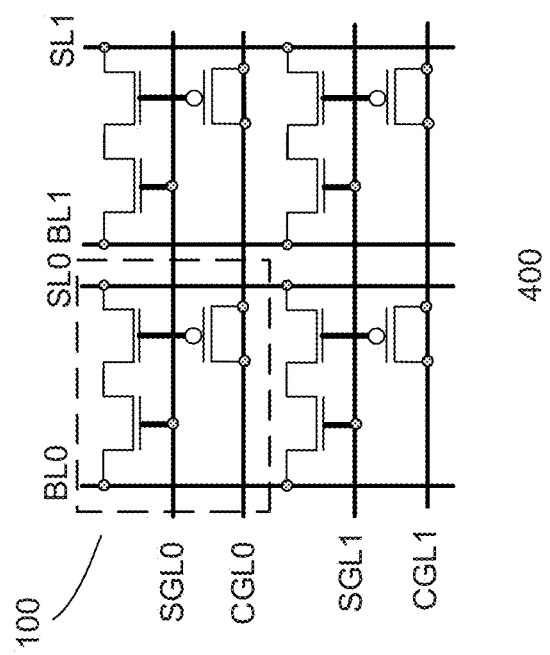
FIG. 4 shows a schematic diagram of an embodiment of an array of memory cells.

FIG. 4 shows a schematic diagram of an embodiment of an array 400 of memory cells. A portion of the array is shown with, for example, four memory cells 100, such as those described in FIG. 1. Common elements may not be described or described in detail. The memory cells are interconnected to form two columns connected by BLs (BL0 and BL1) and SLs (SL0 and SL1) and two rows of memory cells connected by SGLs (SGL0 and SGL1) and CGLs (CGL0 and CGL1. For example, the portion is a 2×2 portion of the array. It is understood that the array may include numerous rows and columns.

The memory cell of FIGS. 1 and 2a-2d, in one embodiment, is configured to include first type transistors and a first type capacitor. In one embodiment, the first type is n-type. For example, the memory cell is configured with n-type transistors and n-type capacitor. In such cases, the transistor or second well 207 and capacitor or first well 209 include opposite type dopants. The transistor well includes second polarity type or p-type dopants while the control well includes first polarity type or n-type dopants. The diffusion regions of the transistor and capacitor are both n-type. Furthermore, the gate electrodes are doped with capacitor type dopants. For example, the gate electrodes are doped with first polarity type or n-type dopants. Other configurations of transistors and the capacitor may also be useful. For example, the first type dopants are p-type dopants and the second type dopants are n-type dopants. This may be used to provide a memory cell with p-type transistors and a p-type capacitor.

Figure 5B:
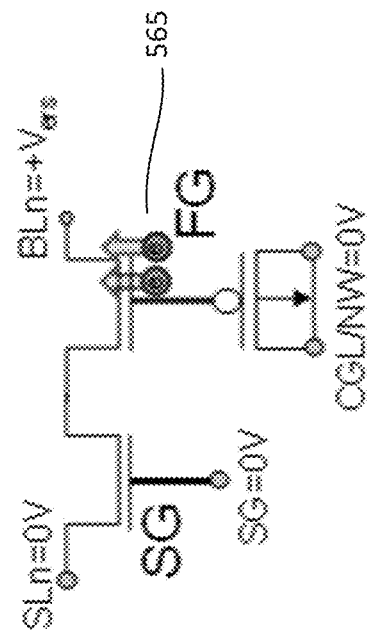
FIGS. 5a-5c show various operating modes of an embodiment of a memory cell.
Figure 5A:
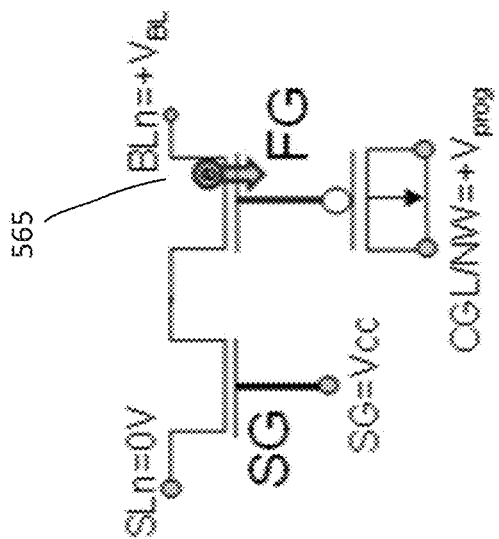
Figure 5C:
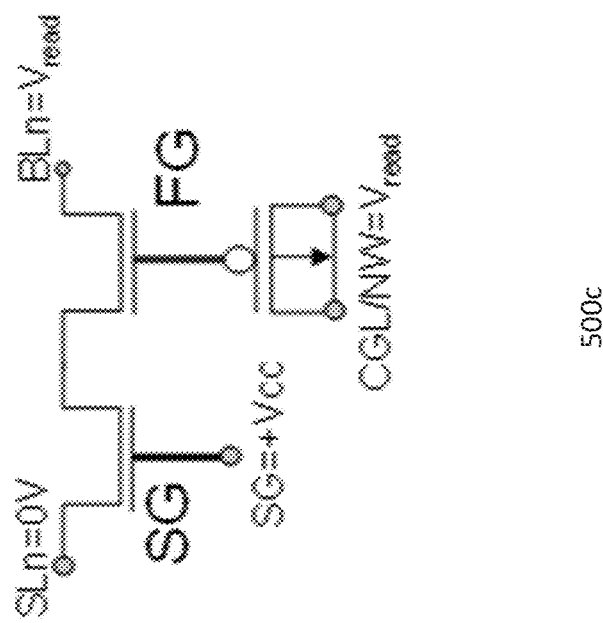

FIGS. 5a-5c show various operating modes of a memory cell with n-type transistors and a n-type capacitor. Table 1 below shows various signals at the various terminals of a memory cell for the different operating modes:

TABLE 1

| Signals | CGL | | BLn | | SLn | | SG (nFET) | | PW (transistor well) |
| --- | --- | --- | --- | --- | --- | --- | --- | --- | --- |
| Modes | sel | unsel | sel | unsel | sel | unsel | sel | unsel | |
| PGM: CHE (bit) | $+V_{prog}$ | 0 V | 0 V | $+V_{inhibit}$ | $+V_{SL}$ | 0 V | $+V_{CC}$ | 0 V | 0 V |
| ERS: FN Source-Side (block) | 0 V | 0 V | 0 V | 0 V | $+V_{ers}$ | $+V_{ers}$ | 0 V | 0 V | 0 V |
| Read | 0 V | 0 V | $+V_{read}$ | 0 V | 0 V | 0 V | $+V_{CC}$ | 0 V | 0 V |

Select (sel) signals are provided at the terminals of a selected cell while unselect (unsel) signals are provided at terminals of non-selected cells. Table 2 below shows exemplary voltages for the different signals:

TABLE 2

| Signals | Values Volts |
| --- | --- |
| $+V_{prog}$ | 9 (CHE) |
| $+V_{ers}$ | 13 |
| $+V_{SL}$ | 9 (CHE) |
| $+V_{read}$ | +Vcc |
| $+V_{CC}$ | 5 |

The values in Table 2 are exemplary. For example, the values are for an operating voltage $V_{CC}$ equal to about 5V. Other voltage values may also be useful.

FIG. 5a illustrates a programming operation 500a of the memory cell. In one embodiment, the programming operation includes channel hot electron (CHE) injection. To effect CHE injection programming, the various sel signals for a programming operation are provided at the various terminals of the selected memory cell. In the CHE programming, electron carriers 565 are injected from the transistor well to the FG on the source side.

FIG. 5b shows an erase operation 500b of the memory cell. In one embodiment, the erase operation includes Fowler-Nordheim (FN) source-side erase operation 500b. To effect a FN source-side erase operation, the various sel signals for an erase operation are provided at the various terminals of the selected memory cell. In a source-side erase operation, electron carriers 565 move from the FG to the source-side of the gate.

As for a read operation 500c it is illustrated in FIG. 5c. The various select (sel) signals for a read operation are provided at the various terminals of the selected memory cell to effect the read operation. A read operation does not involve movement of electrons.

Figure 6:
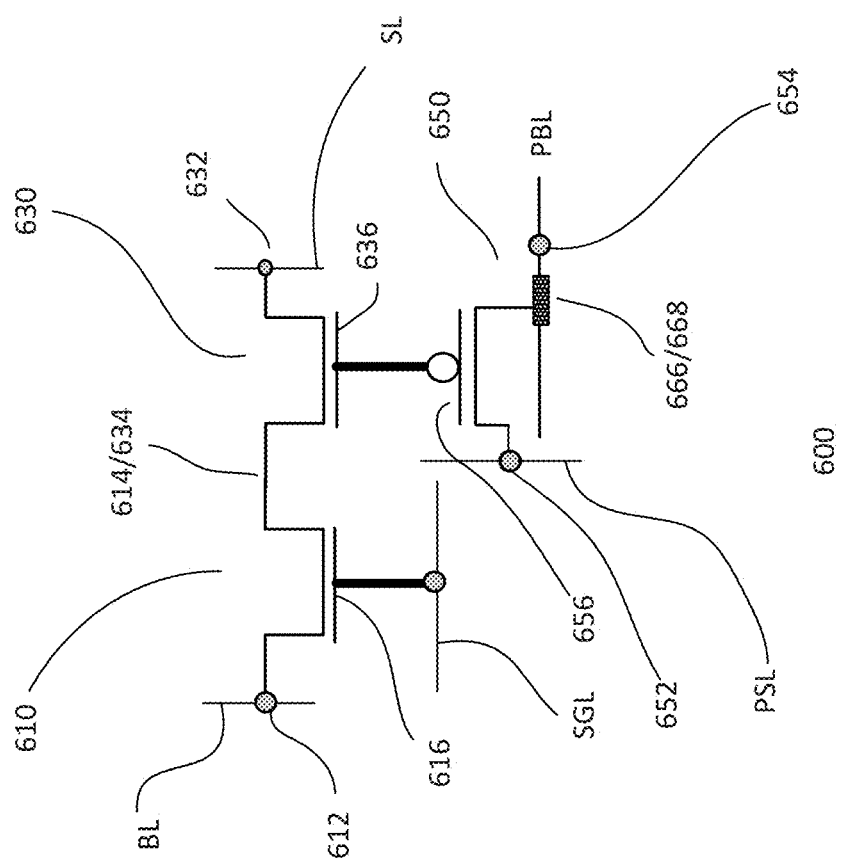
FIG. 6 shows a schematic diagram of an embodiment of a memory cell.

FIG. 6 shows a schematic diagram of an embodiment of a memory cell 600. The memory cell, in one embodiment, is a non-volatile MTP memory cell 600. As shown in FIG. 6, memory cell 600 includes a first transistor 610, a second transistor 630 and a control or program gate 656. In one embodiment, memory cell may be a MTP memory cell, such as a non-volatile (NV) MTP memory cell. The memory cell may be similar to that described in FIGS. 1 and 2a-2d. Common elements may not be described or described in detail.

The first and second transistors are, for example, metal oxide semiconductor (MOS) transistors. A transistor includes a gate between first and second diffusion regions. A gate includes a gate electrode and a gate dielectric. The first transistor serves as an access transistor while the second transistor serves as a storage transistor. For example, the access transistor includes a first access diffusion region 612, a second access diffusion region 614 and an access gate 616; the storage transistor includes a first storage diffusion region 632, a second storage diffusion region 634 and a storage gate 636. The access gate 616 may be referred to as a select gate and the storage gate 636 may be referred to as a floating gate.

In one embodiment, the control gate is a part of a control transistor 650. For example, the control transistor 650 includes a control gate 656 disposed between first and second control diffusion regions 652 and 654. The access and storage transistors are coupled in series. For example, the second access diffusion region and second storage diffusion region form a common diffusion region of the transistors. As for the control gate and storage gate electrodes, they are commonly coupled. By commonly coupling the control and storage gates 656 and 636, a floating storage gate is produced. In one embodiment, a common gate electrode is provided for the control and storage gates. Other configurations of the storage and control gates may also be useful.

Diffusion regions of the transistors may include base halo and LDD regions (not shown). For example diffusion regions of the access, storage and control transistors may include base halo and LDD regions. The halo region is a lightly doped region with second polarity type dopants. As for the LDD region, it is a lightly doped region with first polarity type dopants. For example, the halo region includes p-type dopants for a n-type transistor while the LDD region includes n-type dopants for a n-type transistor. The dopant concentrations of the halo and LDD regions are lower than the transistor diffusion region. In general, the dopant concentration of the LDD is heavier or higher than the halo region. For example, the dopant concentration of the base halo region is about $1E12$ $cm^{-3}$ and the dopant concentration of the base LDD region is about $1E13$ $cm^{-3}$. Providing other dopant concentrations for the base LDD and halo regions may also be useful. For example, the dopant concentrations may be varied depending on the technology node. A depth of the LDD region is $D_L$ and a depth of the halo region is $D_H$. For example, the transistor halo and LDD regions have a depth from the surface of the substrate to $D_L$ and $D_H$, respectively. The depths $D_L$ and $D_H$ are shallower than $D_T$. In general, the LDD region is shallower than the halo region. For example, $D_L$ is less than $D_H$ ($D_L<D_H$). The halo and LDD regions extend under the gate. In one embodiment, a halo region extends further below the gate than a LDD region. The halo region, for example, extends beyond the LDD region.

In one embodiment, the access and storage transistors are first polarity type transistors while the control transistor is a second polarity type transistor. For example, the access and storage transistors are opposite polarity type to that of the control transistor. In one embodiment, the access and storage transistors are n-type transistors while the control transistor is a p-type transistor. Providing access and storage transistors which are p-type transistors while the control transistor is a n-type transistor may also be useful. In other embodiments, all transistors of the memory cell may be of the same type. For example, the access, storage and control transistors may be n-type or p-type transistors. Other configurations of transistors may also be useful.

In one embodiment, the second control diffusion region includes an asymmetrical halo and LDD regions 666 and 668. The asymmetrical halo and LDD regions may be similar to the base halo and LDD regions except that they have higher dopant concentrations. For example, the asymmetrical halo and LDD regions may have similar depths to the base halo and LDD regions and overlap the base halo and LDD regions, but the asymmetrical halo and LDD regions have higher dopant concentrations than the base halo and LDD regions. For example, the asymmetrical halo and LDD regions may be intermediately doped regions with second and first polarity type dopants, respectively. In one embodiment, the asymmetrical halo and LDD regions are provided only on the second control diffusion region 654. For example, the first control diffusion region 652 includes only base halo and LDD regions. This produces an asymmetrical control transistor.

The first access diffusion region 612 of first or access transistor 610 is coupled to a bit line (BL) of the memory device. The first storage diffusion region 632 of second or storage transistor 630 is coupled to a source line (SL) of the memory device. The access or select gate 616 of the first transistor 610 is coupled to a select gate line (SGL) of the memory device. The second control diffusion region is coupled to a program gate bitline line (PBL) and the first control diffusion region is coupled to a program gate source line (PSL). In one embodiment, the SGL is disposed along a first direction, such as a wordline direction, while the BL is disposed along a second direction, such as the bitline direction. The first and second directions, for example, are orthogonal to each other. As for the PBL, it is disposed along the wordline direction and the SL and PSL are disposed along the bitline direction. Other configurations of BL, SGL, PBL, PSL and SL may also be useful. For example, the SL may be a common SL for memory cells of an array.

As described, the memory cell includes an asymmetrical control transistor. In one embodiment, the asymmetrical control transistor includes a second control diffusion region with asymmetrical halo and LDD regions and a first control diffusion region without asymmetrical halo and LDD regions. For example, the first control diffusion region includes only base halo and LDD regions. The asymmetry of the control transistor creates high lateral field near the second control diffusion region due to more abrupt p-n junction profile, resulting in improved CHE programming efficiency.

Furthermore, the asymmetrical halo and LDD regions, as described, may be formed by a second implant. The second implant, for example, may be an implant used to form halo and LDD regions of other devices, such as HV and/or LV devices of the same polarity type as the storage and access transistors. For example, a first halo and LDD implant of HV and/or LV devices may be a second implant of other devices, such as MV devices. This enables the same mask used to form the halo and LDD regions of HV and/or LV devices to be used to form the asymmetrical halo and LDD regions of the control transistor. The use of the same mask enables the asymmetrical device to be formed without the need of extra masks, reducing costs.

Figure 7:
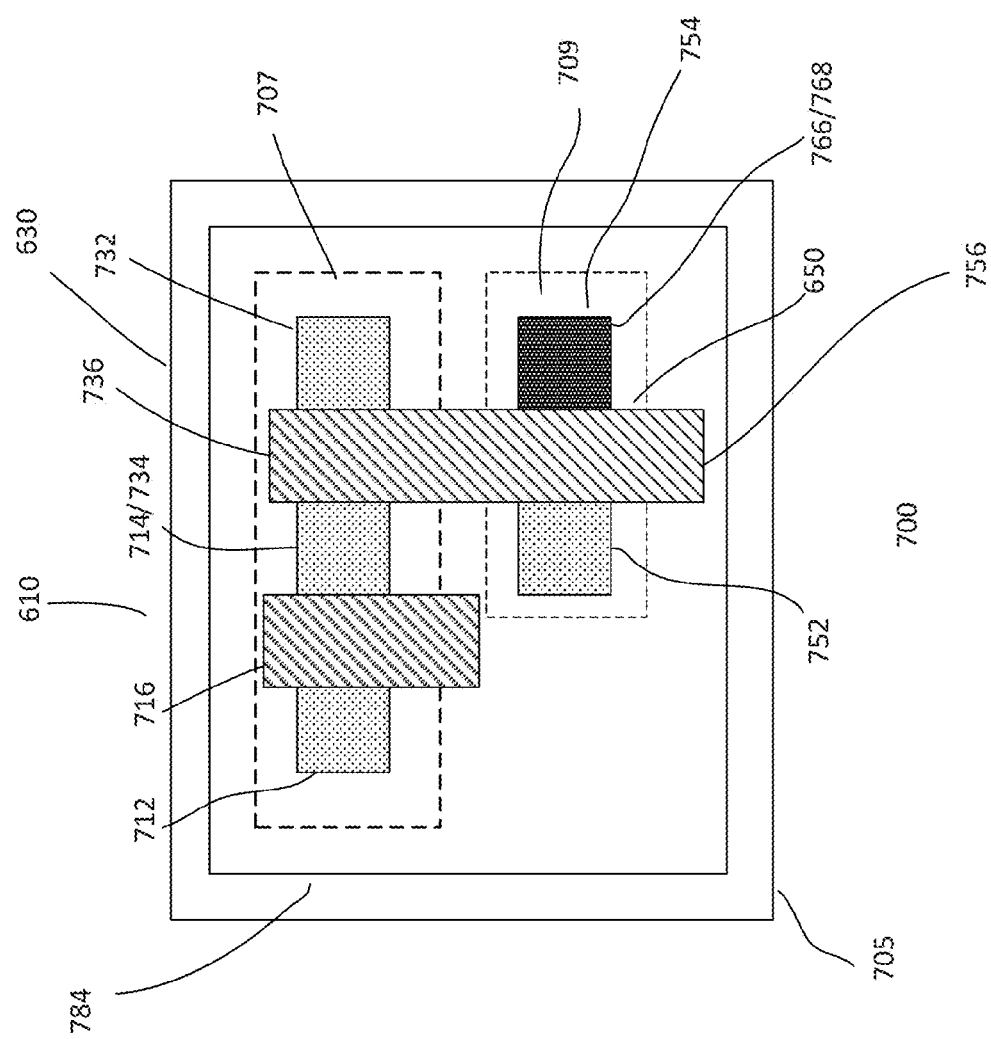
FIG. 7 shows a plan view of an embodiment of a memory cell.

FIG. 7 shows a plan view of an embodiment of device. The device includes a memory cell 700. In one embodiment, the memory cell is a NVM cell. For example, the memory cell is a NVM MTP cell. The memory cell is similar to that described in FIGS. 1, 2a-2d and 6. Common elements may not be described or described in detail.

The device is disposed on a semiconductor substrate 705, such as a silicon substrate. Other types of semiconductor substrates may also be useful. The substrate may include a cell region 784. The cell region, for example, is a region in which the memory cell is disposed. Although one cell region is shown, the device may include a plurality of cell regions having memory cells interconnected to form a memory array. Additionally, the substrate may include other types of device regions, depending on the type of device or IC. For example, the device may include HV, MV and/or LV devices.

The cell region includes first and second wells 709 and 707. The first well serves as a control well for a control gate 756 while the second well serves as a transistor well. For example, the transistor well serves as a well for access (or select) and storage transistors 610 and 630. In one embodiment, the control gate includes a control transistor 650. The control transistor may be a MOS transistor. Other types of control gates may also be useful.

As shown, the wells are disposed adjacent to each other. The first well accommodates the control gate and the second well accommodates the access and storage transistors. The control well includes control well dopants and the transistor well includes transistor well dopants. The control well may be lightly doped with control well dopants. As for the transistor well, it is a lightly doped well with transistor well dopants. In one embodiment, the transistors form MV devices. The wells, for example, may be tailored for MV devices. For example, wells for MV and LV devices may include different dopant concentrations to accommodate different gate configurations, such as a thicker gate dielectric layer for MV devices. Other control and/or transistor well dopant concentrations may also be useful. As shown, the wells are difference sized wells. Other configurations of wells may also be useful.

The polarity type of the control well dopants depends on the type of control gate. In one embodiment, the polarity type of the control well depends on the polarity type of the control transistor. In the case of a MOS transistor, the control well is the opposite polarity as the control transistor type. For example, the control well dopant type is n-type for a p-type MOS transistor. As for the polarity of the transistor well dopants, it is the opposite of the transistor type. For example, the transistor well dopant type is n-type for p-type transistor. In one embodiment, the transistor well dopants are second polarity type dopants for a first type transistor with first polarity type dopants.

A cell isolation region (not shown) separates the first and second wells as well as the other device regions. The cell isolation region sufficiently isolates the different wells. For example, the cell isolation region provides sufficient overlap to the different wells. The cell isolation region defines the active region in the first and second wells. For example, the cell isolation region defines the active transistor regions of the transistors in the second well and active control (or capacitor) region in the first well. The cell isolation region, for example, is a shallow trench isolation region. Other types of isolation regions may also be useful.

Access and storage transistors are disposed in the transistor active region in the second or transistor well. A transistor includes a gate between first and second diffusion regions. The diffusion regions have transistor dopants of the same polarity type as the transistor type. For example, n-type transistors have diffusion regions with n-type dopants. In one embodiment, the diffusion regions include first polarity type transistor dopants for first polarity type transistors. The diffusion regions are, for example, heavily doped regions. The gate is disposed on the substrate while the diffusion regions are disposed in the active region. A gate includes a gate electrode and a gate dielectric. The gate electrode, for example, may be polysilicon gate electrode and the gate dielectric may be silicon oxide gate dielectric. Other types of gate electrode or dielectric materials may also be useful.

For example, the access transistor 610 includes first and second access diffusion regions 712 and 714 heavily doped with transistor type dopants in the transistor active region and an access gate 716 on the substrate. The access gate includes an access gate electrode over an access gate dielectric. The access gate may be referred to as a select gate. The storage transistor 630 includes first and second storage diffusion regions 732 and 734 heavily doped with transistor type dopants in the substrate and a storage gate 736 on the substrate. The storage gate includes a storage gate electrode over a storage gate dielectric. The storage gate may be referred to as a floating gate. The access and storage transistors 610 and 630 are coupled in series. In one embodiment, the second access diffusion region and second storage diffusion region form a common diffusion region of the transistors. Other configurations of series connection for the access and storage gates may also be useful.

The control gate is disposed on the first well. As discussed, the control gate, in one embodiment, is a control transistor. The control transistor includes a control gate 756 disposed on the substrate over the control (or capacitor) active region within the first well. The control gate, in one embodiment, is part of a control transistor. For example, first and second control diffusion regions 752 and 754 are disposed in the substrate adjacent to sides of the control gate. In the case of a control transistor, the first well includes control dopants which are opposite polarity to that of the control diffusion regions. For example, control diffusion regions include first polarity type dopants while the control well dopants are of a second polarity type. The control gate includes a control gate electrode over a control gate dielectric. The control gate electrode, for example, may be a polysilicon control gate electrode and the control gate dielectric may be silicon oxide control gate dielectric. Other types of gate electrode or dielectric materials may also be useful. In one embodiment, the control gate is heavily doped with first polarity type dopants. For example, the control gate may be doped before forming the control diffusion regions. For example, a gate electrode layer deposited on the substrate is pre-doped with control dopants and patterned to form the control gate electrode. Other configurations of control gates may also be useful.

A transistor diffusion region, in one embodiment, may include base halo and LDD regions (not shown). The halo region is a lightly doped region with second polarity type dopants. As for the LDD region, it is a lightly doped region with first polarity type dopants. For example, the halo region includes p-type dopants for a n-type transistor while the LDD region includes n-type dopants for a n-type transistor. The dopant concentrations of the halo and LDD regions are lower than the transistor diffusion region. In general, the dopant concentration of the LDD is heavier or higher than the halo region. For example, the dopant concentration of the base halo region is about $1E12/cm^3$ and the dopant concentration of the base LDD region is about $1E13/cm^3$. Providing other dopant concentrations for the base LDD and halo regions may also be useful. For example, the dopant concentrations may be varied depending on the technology node. A depth of the LDD region is $D_L$ and a depth of the halo region is $D_H$. For example, the transistor halo and LDD regions have a depth from the surface of the substrate to $D_L$ and $D_H$, respectively. The depths $D_L$ and $D_H$ are shallower than $D_T$. In general, the LDD region is shallower than the halo region. For example, $D_L$ is less than $D_H$ ($D_L < D_H$). The halo and LDD regions extend under the gate. In one embodiment, a halo region extends further below the gate than a LDD region. The halo region, for example, extends beyond the LDD region.

In one embodiment, the second control diffusion region 754 includes an asymmetrical halo and LDD regions 766 and 768. The asymmetrical halo and LDD regions may be similar to the base halo and LDD regions except that they have higher dopant concentrations. For example, the asymmetrical halo and LDD regions may have similar depths to the base halo and LDD regions and overlaps the base halo and LDD regions, but the asymmetrical halo and LDD regions have higher dopant concentrations than the base halo and LDD regions. For example, the asymmetrical halo and LDD regions may be intermediately doped regions with second and first polarity type dopants, respectively. This produces an asymmetrical control transistor.

In another embodiment, an asymmetrical control transistor includes an asymmetrical LDD region in the second control diffusion region and only a base LDD region in the first control diffusion region. For example, the transistors include only LDD regions without halo regions. Other asymmetrical transistor configurations may also be useful.

As described, the memory cell includes an asymmetrical control transistor. In one embodiment, the asymmetrical control transistor includes a second control diffusion region 754 with asymmetrical halo and LDD regions and a first control diffusion region 752 without asymmetrical halo and LDD regions. For example, the first control diffusion region includes only base halo and LDD regions. The asymmetry of the control transistor creates high lateral field near the second control diffusion region, resulting in improved programming efficiency.

In one embodiment, the control and storage gates are commonly coupled. In one embodiment, the control and storage gates form an integral unit. For example, the control and storage gates are formed of the same gate layers. For example, patterning the gate layers create the control and storage gates as a unit. In such cases, the control gate and storage gate are formed of the same material. For example, the gate electrodes are doped with control type dopants. In one embodiment, the access, storage and control gates are formed from the same gate layer. Other configurations of the gates may also be useful. For example, the gates may be formed from different gate layers.

Metal silicide contacts (not shown) may be provided on contact regions of the memory cell. The metal silicide contacts, for example, may be nickel or nickel-based metal silicide contacts. Other types of metal silicide contacts may also be useful. In one embodiment, metal silicide contacts are provided on the transistor diffusion regions and the gates. A silicide block may be disposed over the storage and control gates. The silicide block, for example, is a dielectric material, such as silicon oxide. Other types of silicide blocks may also be useful. The silicide block prevents formation of silicide contacts over the storage and control gates. This improves data retention.

posed in the same direction may be provided in the same metal level. For example, SGL and PBL may be disposed on the same level while BL, PSL and SL may be disposed on the same level. For example, SGL and PBL may be disposed on M1 while BF, PSL and SL may be on M2 of the device. Other configurations of conductive lines and metal levels may also be useful.

Figure 8:
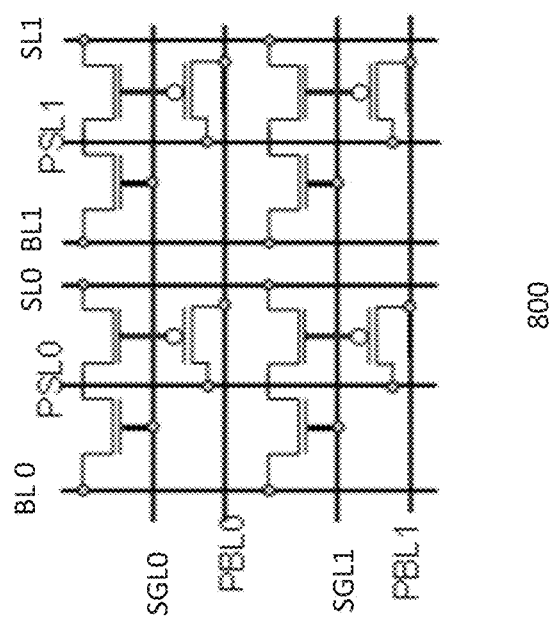
FIG. 8 shows a schematic diagram of an embodiment of an array of memory cells.

FIG. 8 shows a schematic diagram of an embodiment of an array 800 of memory cells. A portion of the array is shown with, for example, four memory cells, such as those described in FIGS. 6 and 7. Common elements may not be described or described in detail. The memory cells are interconnected to form two columns of memory cells connected by BLs (BL0 and BL1), SLs (SL0 and SL1) and PSLs (PSL0 and PSL1), and two rows of memory cells connected by SGLs (SGL0 and SGL1) and PBLs (PBL0 and PBL1). For example, the portion is a 2×2 portion of the array. It is understood that the array may include numerous rows and columns.

The memory cell of FIGS. 6 and 7, in one embodiment, is configured to include first type access and storage transistors and a second type control transistor. In one embodiment, the first type is n-type. For example, the memory cell is configured with n-type access and storage transistors and a p-type control transistor. In such cases, the transistor or second well 707 and control or first well 709 include opposite type dopants. The transistor or yell includes second polarity type or p-type dopants while the control well includes first polarity type or n-type dopants. The diffusion regions of the access and storage transistors are n-type diffusion regions and the control diffusion regions of the control transistor are p-type diffusion regions. Other configurations may also be useful. For example, access and storage transistors may be p-type while the control transistor may be n-type.

Figure 9B:
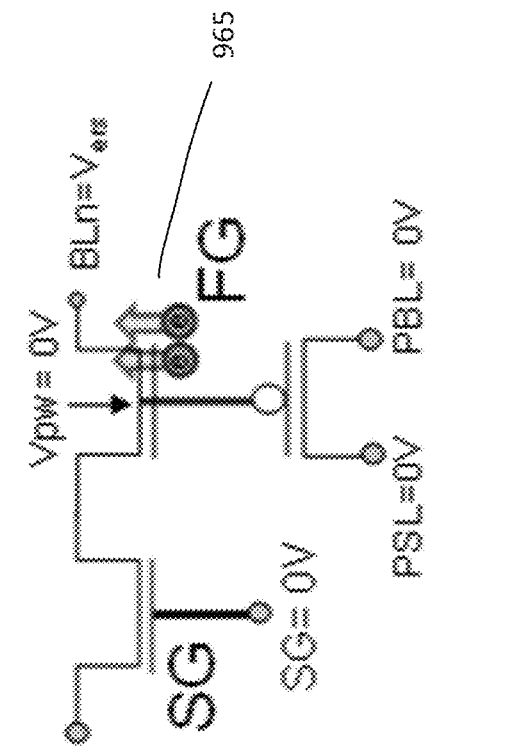
FIGS. 9a-9c show various operating modes of another embodiment of a memory cell.
Figure 9A:
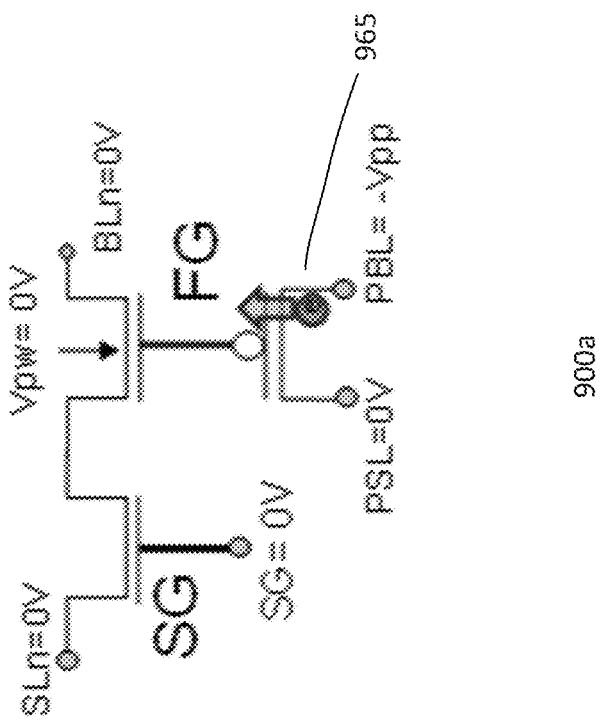
Figure 9C:
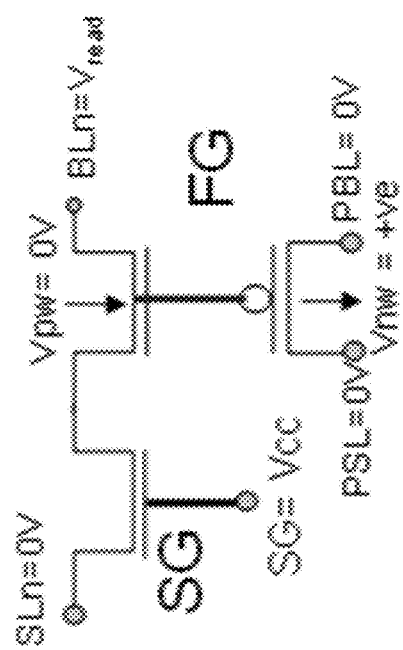

FIGS. 9a-9c show various operating modes of a memory cell with n-type access and storage transistors and a p-type control transistor. Table 3 below shows various signals at the various terminals of a memory cell for the different operating modes:

TABLE 3

| Signals | PBL | | PSL | | BLn | | SLn | | SG | | PW | | |
|---|---|---|---|---|---|---|---|---|---|---|---|---|---|
| Modes | sel | unsel | sel | unsel | sel | unsel | sel | unsel | sel | unsel | sel | unsel | NW |
| PGM: CHE (bit) | $-V_{pp}$ | 0 V | $-V_{SL}$ | $+V_{inhibit}$ | 0 V | 0 V | 0 V | 0 V | 0 V | 0 V | $-V_g$ | 0 V | 0 V |
| ERS: FN Source-Side (block) | 0 V | 0 V | 0 V | 0 V | 0 V | 0 V | $+V_{ers}$ | $+V_{ers}$ | 0 V | 0 V | 0 V | 0 V | 0 V |
| Read | 0 V | 0 V | 0 V | 0 V | $+V_{CC}$ | 0 V | 0 V | 0 V | $+V_{CC}$ | 0 V | 0 V | 0 V | 0 V |

The first access diffusion region 712 is coupled to a BL of the memory array. The first storage diffusion region 732 is coupled to a SL of the memory array. The access gate 716 is coupled to a SGL of the memory array. The second control diffusion region is coupled to PBL while the first control diffusion region is coupled to PSL. In one embodiment, the SGL is disposed along a first direction, such as a wordline direction, while the BL is disposed along a second direction, such as the bitline direction. The PBL may be disposed along the wordline direction and the PSL and SL are disposed along the bitline direction. Other configurations of BF, PBL, PSL, SGL and SL may also be useful.

The various lines of the memory cell may be disposed in metal levels (M) of the device. The conductive lines dis- Select (sel) signals are provided at the terminals of a selected cell while unselect (unsel) signals are provided at terminals of non-selected cells. The value for Vpp, for example, is equal to $V_{prog}$ and $V_{read}$ is equal to Vcc. Exemplary voltages for the different signals are already shown in, for example, Table 2. As shown, 0Vg will be applied on PW. This negative bias is coupled to the FG and turns on the control transistor channel, enabling channel hot electron (CHE) programming to occur.

FIG. 9a illustrates a programming operation 900a of the memory cell. In one embodiment, the programming operation includes channel hot electron (CHE) injection. To effect CHE injection programming, the various sel signals for a program operation are provided at the various terminals of the selected memory cell. In the CHE programming, electron carriers 965 are injected from the control well to the FG on the source side.

FIG. 9b shows an erase operation 900b of the memory cell. In one embodiment, the erase operation includes FN source-side erase operation 900b. To effect a FN source-side erase operation, the various sel signals for an erase operation are provided at the various terminals of the selected memory cell. In source-side erase operation, electron carriers 965 move from the FG to the source-side of the gate.

As for a read operation 900c, it is illustrated in FIG. 9c. The various select (sel) signals for a read operation are provided at the various terminals of the selected memory cell to effect the read operation. A read operation does not involve movement of electrons.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A non-volatile (NV) multi-time programmable (MTP) memory cell comprising:
   a substrate;
   first and second wells disposed in the substrate;
   a first transistor having a select gate and a second transistor having a floating gate adjacent to one another and disposed over the second well;
   a third transistor having a control gate disposed over the first well, wherein the control gate is coupled to the floating gate and the control and floating gates comprise the same gate layer extending across the first and the second wells;
   wherein each of the transistors comprises first and second diffusion regions disposed adjacent to first and second sides of the gates, wherein each of the first and second diffusion regions comprises a lightly doped drain (LDD) region and a halo region, wherein the LDD and halo regions comprise
      base LDD regions having a same LDD dopant concentration and base halo regions having a same halo dopant concentration, and
      only one asymmetrical LDD region having a higher LDD dopant concentration than the base LDD regions and only one asymmetrical halo region having a higher halo dopant concentration than the base halo regions; and
   wherein only the first diffusion region of only the second or third transistor comprises the one asymmetrical LDD and halo regions, wherein the second diffusion regions of the second and third transistors comprise the base LDD and halo regions.

2. The memory cell of claim 1 wherein the first and second transistors are first polarity type transistors, and the third transistor is a first polarity type control capacitor.

3. The memory cell of claim 1 wherein the first and second transistors are provided with a common second diffusion region disposed adjacent to second sides of the select gate and floating gate, wherein the common second diffusion region comprises the base LDD and halo regions.

4. The memory cell of claim 1 wherein a silicide block is disposed directly over the floating gate and control gate.

5. The memory cell of claim 1 wherein:
   the first and second diffusion regions of the second transistor are disposed adjacent to first and second sides of the floating gate; and
   wherein only the first diffusion region of only the second transistor comprises the one asymmetrical LDD and halo regions, wherein the base LDD region of the second diffusion region and the asymmetrical LDD region of the first diffusion region of the second transistor include a same depth from a top surface of the substrate.

6. The memory cell of claim 5 wherein the first diffusion region of the second transistor is coupled to a source line.

7. The memory cell of claim 5 comprising a plurality of contacts surrounding the control gate and coupled to the first well.

8. The memory cell of claim 7 wherein the control gate comprises gate fingers.

9. The memory cell of claim 5, wherein the base halo region of the second diffusion region and the asymmetrical halo region of the first diffusion region of the second transistor include a same depth from a top surface of the substrate.

10. The memory cell of claim 1, wherein the memory cell is programmable by Fowler-Nordheim (FN) tunneling effect or channel hot electron (CHE) injection.

11. The memory cell of claim 1, wherein the memory cell is erasable by FN tunneling effect.

12. The memory cell of claim 1 wherein:
    the first and second transistors are first polarity type transistors; and
    the third transistor is a second polarity type transistor.

13. The memory cell of claim 12 wherein:
    the first and second diffusion regions of the third transistor are disposed adjacent to first and second sides of the control gate; and
    wherein only the first diffusion region of only the third transistor comprises the one asymmetrical LDD and halo regions, wherein the base LDD region of the second diffusion region and the asymmetrical LDD region of the first diffusion region of the third transistor include a same depth from a top surface of the substrate.

14. The memory cell of claim 13 wherein the second diffusion region disposed adjacent to the second side of the select gate and the second diffusion region disposed adjacent to the second side of the floating gate include a common diffusion region.

15. The memory cell of claim 13 wherein the first diffusion region of the third transistor is coupled to a program bit line (PBL).

16. A non-volatile (NV) multi-time programmable (MTP) memory cell comprising:
    a substrate;
    first and second wells disposed in the substrate;
    a first transistor having a select gate and a second transistor having a floating gate adjacent to one another and disposed over the second well; and
    a third transistor having a control gate disposed over the first well, wherein the control gate is coupled to the floating gate and the control and floating gates comprise the same gate layer extending across the first and the second wells;
    wherein each of the transistors comprises first and second diffusion regions disposed adjacent to first and second sides of the gates, wherein each of the first and second diffusion regions comprises a lightly doped drain (LDD) region, wherein the LDD region comprise base LDD regions having a same dopant concentration and only one asymmetrical LDD region having a higher dopant concentration than the base LDD regions; and wherein only the first diffusion region of only the second or third transistor comprises the one asymmetrical LDD region, wherein each of the second diffusion regions of the second and third transistors comprise the base LDD region.

17. The memory cell of claim 16 wherein:

the first well is a n-type well and the second well is a p-type well;

each of the floating gate and the select gate comprises an n-type metal-oxide semiconductor (NMOS); and the control gate comprises a n-type capacitor.

18. The memory cell of claim 16 wherein:

the first and second diffusion regions of the second transistor is disposed adjacent to first and second sides of the floating gate; and wherein only the first diffusion region of only the second transistor comprises the one asymmetrical LDD region, wherein the base LDD region of the second diffusion region and the asymmetrical LDD region of the first diffusion region of the second transistor include a similar depth from a top surface of the substrate.

19. A non-volatile (NV) multi-time programmable (MTP) memory cell comprising:

a substrate;

first and second wells disposed in the substrate;

a storage transistor having a floating gate disposed over the second well; and a control transistor having a control gate disposed over the first well, wherein the control gate is coupled to the floating gate and the control and floating gates comprise the same gate layer extending across the first and the second wells, the storage and control transistors each comprises first and second diffusion regions disposed adjacent to first and second sides of the gates, wherein each of the first and second diffusion regions comprises a lightly doped drain (LDD) region, wherein the LDD region include a similar depth from a top surface of the substrate; and wherein the second diffusion regions of the storage and control transistors each comprise a base LDD region having a same LDD dopant concentration, wherein only the first diffusion region of only the storage or control transistor comprises a non-base LDD region having a substantially higher dopant concentration relative to the base LDD regions to define an asymmetrically doped LDD region.

20. The memory cell of claim 19 wherein:

only the first diffusion region of only the storage transistor comprises the non-base LDD region;

the second diffusion region of the storage transistor comprises the base LDD region; and wherein the higher dopant concentration of the non-base LDD region of the storage transistor creates a high lateral field about the first diffusion region of the storage transistor during programming operations.

* * * * *